(12) United States Patent
Kesling et al.

(10) Patent No.: US 8,988,255 B2
(45) Date of Patent: Mar. 24, 2015

(54) APPARATUS AND METHOD FOR CODING DATA BASED ON PHASOR DISPARITY

(75) Inventors: Dawson W. Kesling, Davis, CA (US); Maynard C. Falconer, Portland, OR (US); Kevin P. Slattery, Hillsboro, OR (US); Harry G. Skinner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/006,702

(22) PCT Filed: Oct. 1, 2011

(86) PCT No.: PCT/US2011/054498
§ 371 (c)(1),
(2), (4) Date: Sep. 23, 2013

(87) PCT Pub. No.: WO2013/048537
PCT Pub. Date: Apr. 4, 2013

(65) Prior Publication Data
US 2014/0009315 A1    Jan. 9, 2014

(51) Int. Cl.
*H03M 7/00* (2006.01)
*H03M 7/02* (2006.01)
*H04L 27/34* (2006.01)

(52) U.S. Cl.
CPC ............. *H03M 7/02* (2013.01); *H04L 27/3411* (2013.01)
USPC .............................................. 341/50; 341/51

(58) Field of Classification Search
USPC ................. 341/50, 51; 375/E1.002; 708/190; 714/732
See application file for complete search history.

(56) References Cited

U.S. PATENT DOCUMENTS

| | | | | |
|---|---|---|---|---|
| 6,081,549 | A * | 6/2000 | Shou et al. | 375/152 |
| 6,324,209 | B1 * | 11/2001 | Li et al. | 375/146 |
| 6,882,680 | B1 * | 4/2005 | Oleynik | 375/147 |
| 8,064,499 | B2 * | 11/2011 | Stafford | 375/149 |
| 2003/0115533 | A1 | 6/2003 | Asada et al. | |
| 2005/0008097 | A1 | 1/2005 | Tjhung et al. | |
| 2009/0016459 | A1 | 1/2009 | Kim et al. | |

FOREIGN PATENT DOCUMENTS

WO    WO 2012/087599    6/2012
WO    2013/048537 A1    4/2013

OTHER PUBLICATIONS

International Search Report dated Apr. 17, 2012 for corresponding Application No. PCT/US2011/054498.
International Preliminary Report on Patentability and Written Opinion received for PCT Patent Application No. PCT/US2011/054498, mailed on Apr. 10, 2014, 5 pages.

* cited by examiner

*Primary Examiner* — Brian Young
(74) *Attorney, Agent, or Firm* — KED & Associates

(57) ABSTRACT

A method for managing information includes receiving bits of data, determining phasors for bits at only one frequency of a transmission spectrum, combining the phasors of bits that form a phasor having a spectral energy that lies within a predetermined range, and forming a codeword from the bits of the combined phasors.

30 Claims, 11 Drawing Sheets

APPARATUS AND METHOD FOR CODING DATA BASED ON PHASOR DISPARITY

FIELD

One or more embodiments described herein relate to processing data.

BACKGROUND

Data terminals are continuously evolving to handle greater market demand. The input/output (IO) units in these terminals generate interference which reduces receiver/transmitter performance. One attempt to reduce interference involves the use of conductive shielding. This approach has proven unsatisfactory for increasing costs, weight, physical size, manufacturing time and complexity.

DETAILED DESCRIPTION

Figure 1:
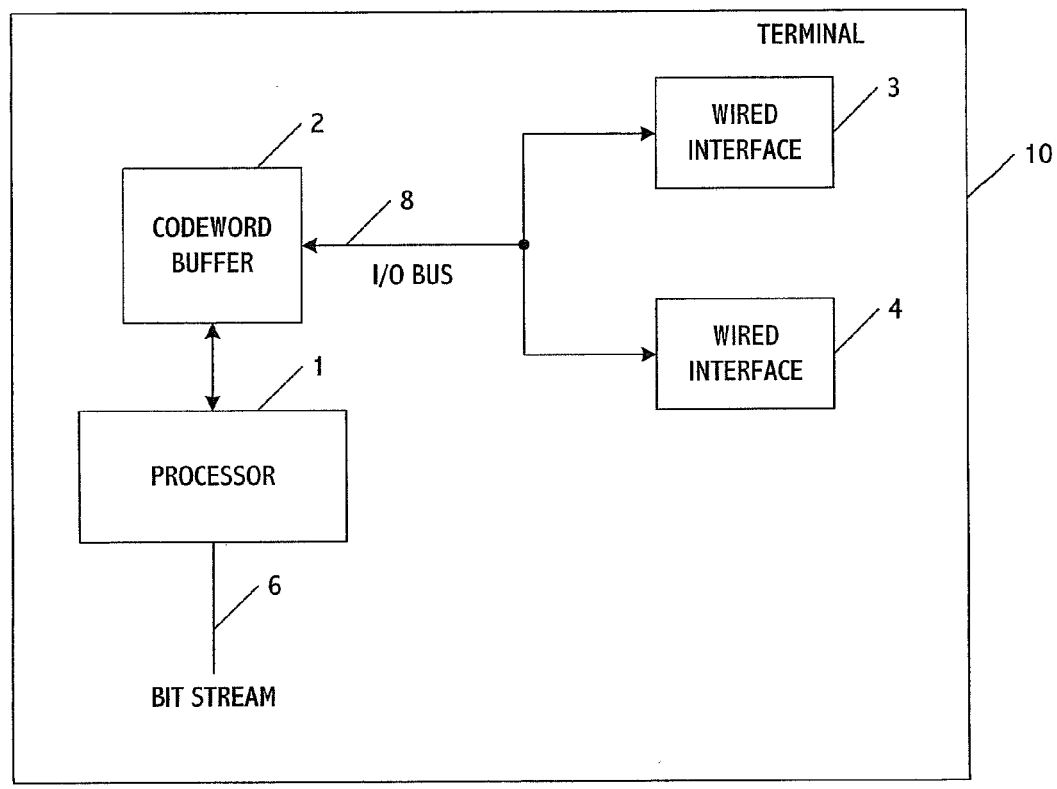
FIG. 1 shows an example of an electronic terminal.

FIG. 1 shows an example of an electronic terminal 10 for transmitting and receiving data. The terminal may be any one of a variety of portable devices including but not limited to a smart or other type of mobile phone, a media terminal, a media player, a laptop or notebook computer, a personal digital assistant, a camera or camcorder with enhanced capability, a television or monitor, a navigation system, or any one of a number of other portable devices that are capable of transmitting and receiving data. Alternatively, the terminal may be a stationary device such as but not limited to a desktop computer or an audio or speaker system.

As shown in FIG. 1, the terminal includes a processor 1 for receiving a bit stream from a signal line 6, a codeword buffer 2 for generating codewords of one or more predetermined bit lengths from the bit stream, and one or more interface units. The bit stream may come from any one of a plurality of applications, functions, or operations to be performed on the terminal. For example, the bit stream may correspond to information transmitted in connection with a voice or video call, a message such as a text or e-mail message, or data generated by an application executed on the terminal.

The processor generates codewords from the bits in the bit stream. The processor may be one or more processing or controller chips which performs control functions for the entire terminal, or may perform one or more specially dedicated functions for the terminal such as call, message, or media transmission and management. The processor is controlled by programs stored in a terminal memory, and transmits the codewords to one or more of the interface circuits along an N-bit IO bus, where, for example, N may include or correspond to the number of bits in each codeword.

The one or more interface circuits may include a wired interface 3, a wireless interface 4, or both, equipped with respective transmitter (Tx) and/or receiver (R) circuits. The codewords transmitted from these circuits may be contained in packets and transmitted according to any one of a variety of communications standards and or protocols. In one application, the wired interface may be a Universal Serial Bus, Ethernet, or other protocol interface used for data transmissions.

Figure 2:
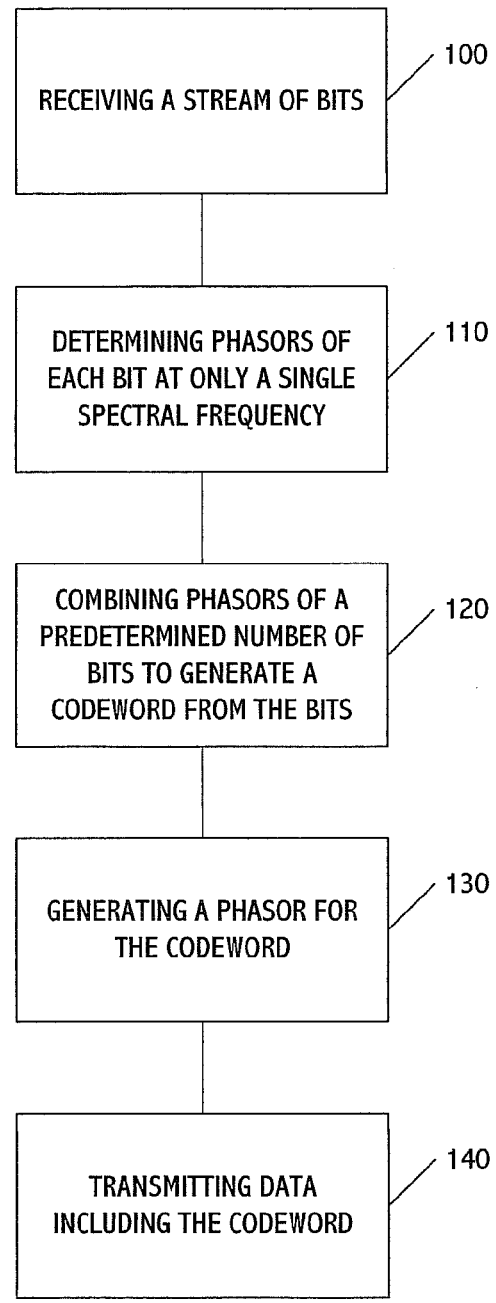
FIG. 2 shows one embodiment of a method for processing data in the terminal.

FIG. 2 shows operations included in one embodiment of a method for processing data in a terminal The terminal may the one shown in FIG. 1 or another type of terminal. An initial operation includes receiving a bit stream (Block 100), which may include bits generated in any of the aforementioned ways. In one illustrative application, the bits correspond to a call or message to be transmitted from a smart phone over the wireless interface.

A second operation includes determining a phasor for each bit in the bit stream within a predetermined spectral frequency range that is less than an entire spectral frequency spectrum over which data communications takes place for the terminal. According to one embodiment, the phasor for each bit is determined at only a single spectral frequency. (Block 110).

Moreover, the phasor for each bit may be determined in a variety of ways. One way begins with the understanding that a single data bit on an IO bus may be spectrally represented by a pulse at a single frequency over time. Each pulse (bit) in a bit stream contributes to the net spectrum of the bit stream waveform, and may be represented by the following Equation (1):

$$H(f) = A \operatorname{sinc}(f/BR) \times e^{-j2\pi b \cdot f/BR} \quad (1)$$

This meaning of this equation may be explained with reference to FIGS. 3(a) to (c). In these figures, A is the pulse amplitude, BR is the bus bit rate, BT is the bit time (inverse of bit rate), and b is the bit location (measured in bit times from zero).

Figure 3A:
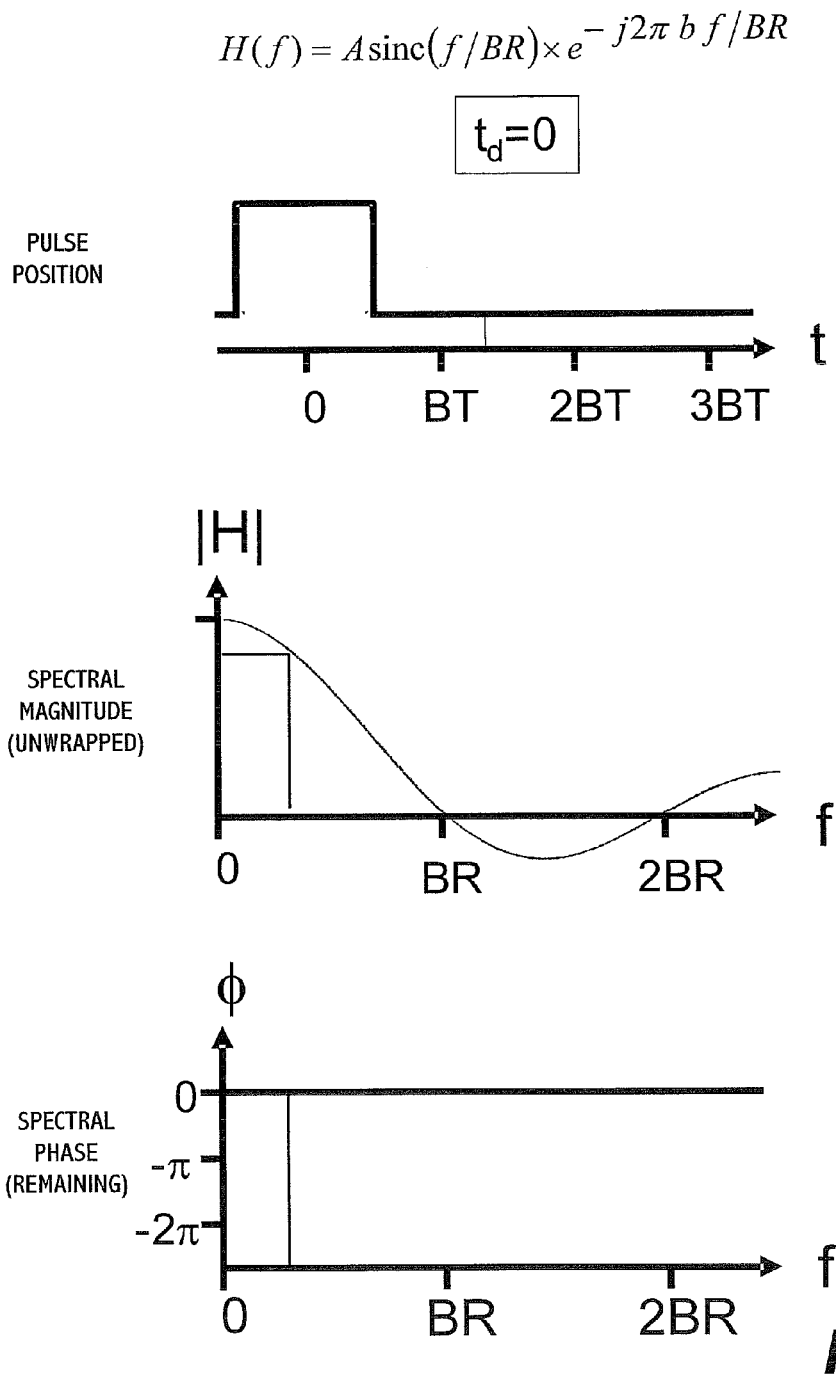
FIGS. 3(a)-3(c) show examples of spectral components of pulses representing data bits.

In FIG. 3(a), the pulse position is located at an initial time (t=0), the spectral magnitude takes the form of a descending waveform from a peak position at time, t=0, and establishing a minimum at a frequency between BR and 2BR, and the spectral phase is substantially 0°.

Figure 3B:
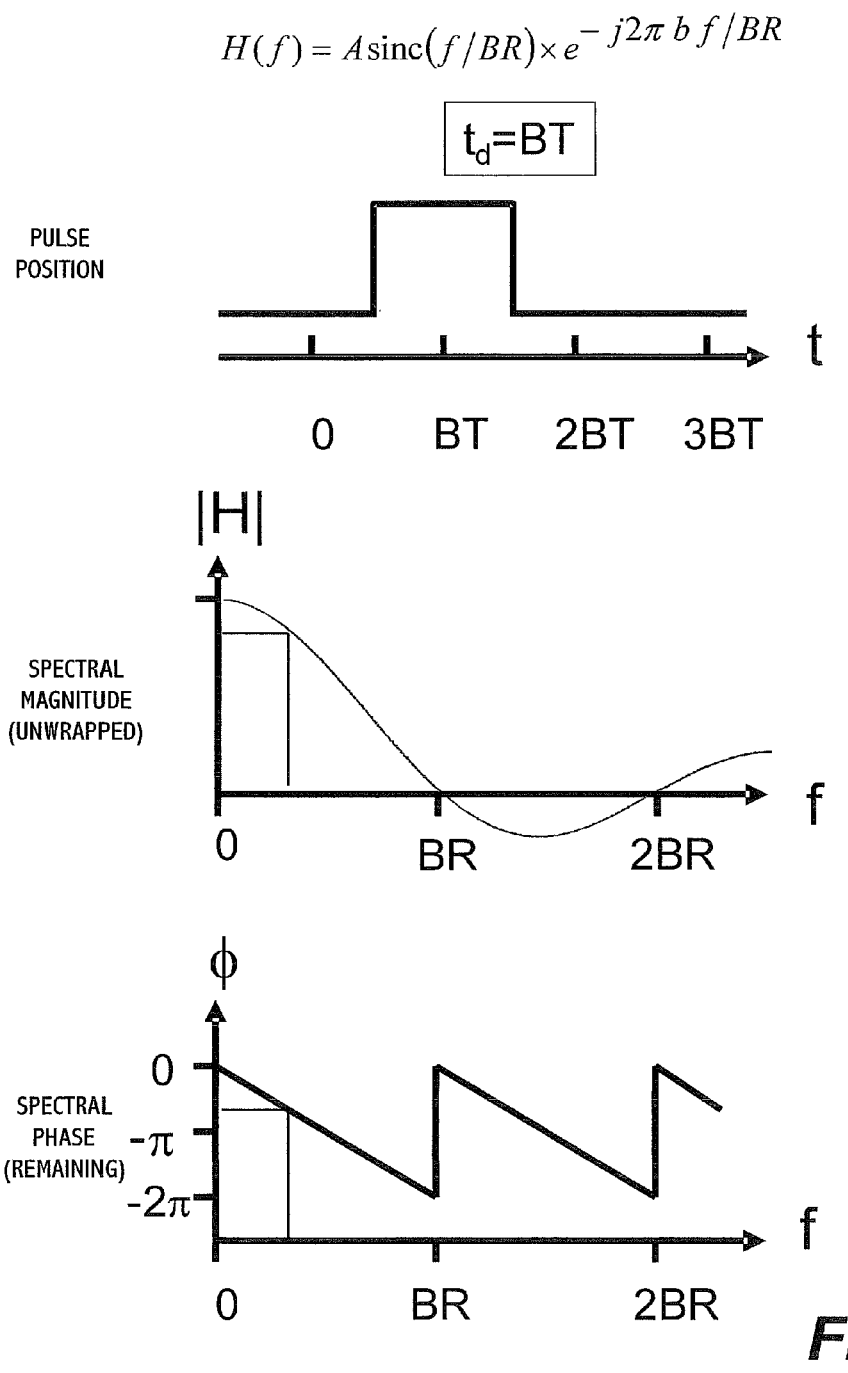

In FIG. 3(b), the pulse position is located at time, t=BT, the spectral magnitude has essentially the same descending waveform, and the spectral phase is a series of connected descending ramp waveforms (e.g., sawtooth), each ramp waveform spanning a phase range of 360° over a frequency range of one BR.

Figure 3C:
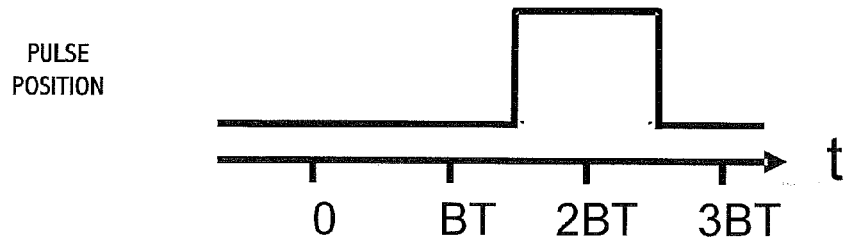
Figure 3C:
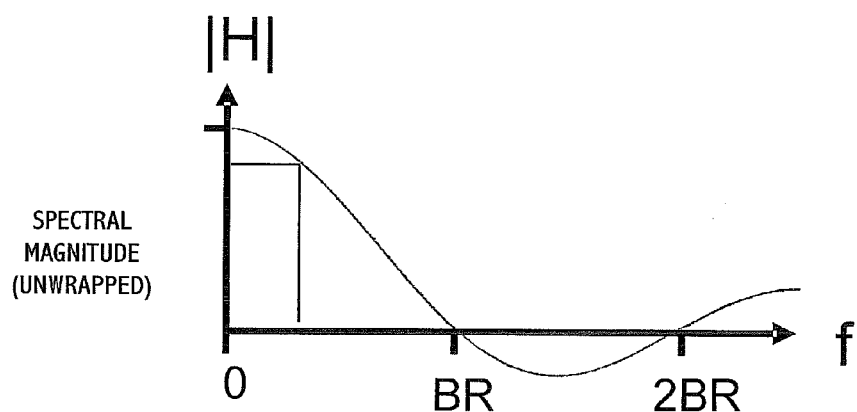
Figure 3C:
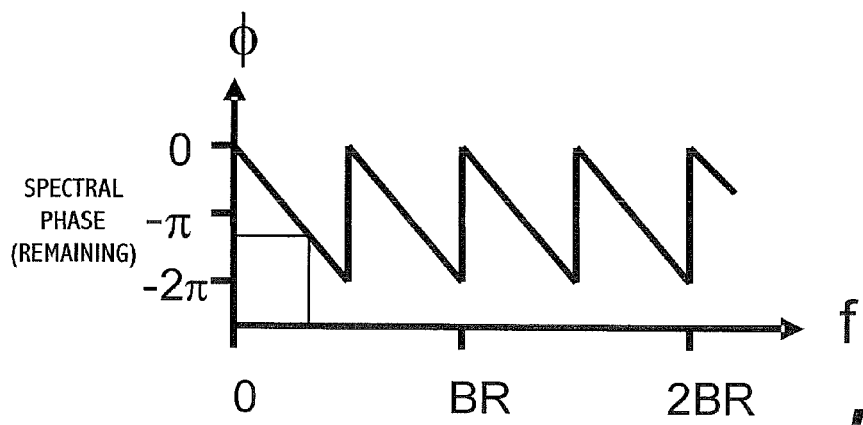

In FIG. 3(c), the pulse position is located at time, t=2BT, the spectral magnitude has the same descending waveform, and the spectral phase is a series of connected descending ramp waveforms, each ramp waveform spanning a phase range of 360° over a frequency range of ½ BR.

Figure 4:
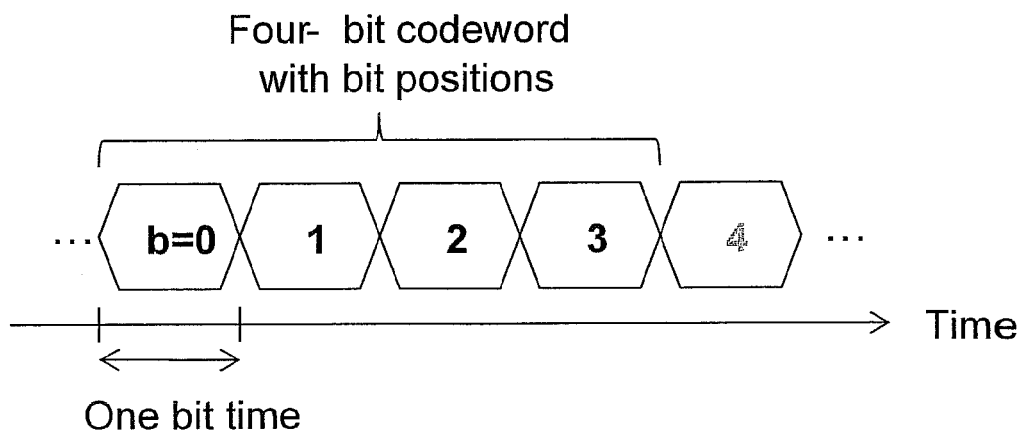
FIG. 4 shows an example of reference bit positions for a 4-bit codeword.

From these figures and Equation (1), the phasor of a data bit may be defined as the complex vector (a vector in the complex plane) given by the spectral magnitude and phase angle of the bit taken at a single frequency of interest. To assist in the understanding of these phasors, consider the case where a codeword is formed from four bits, where each bit is expressed by a phasor that occupies one of four bit positions (b=0, 1, 2, and 3) as shown in FIG. 4. These bit positions may have a spectral magnitude and phase defined by Equations (2) and (3) for a bit rate BR=¼.

$$H(f)=A\ \text{sinc}(f/4) \times e^{-j\phi(f)} \quad (2)$$

$$\phi(f)=-\pi b/2 \quad (3)$$

Figure 5:
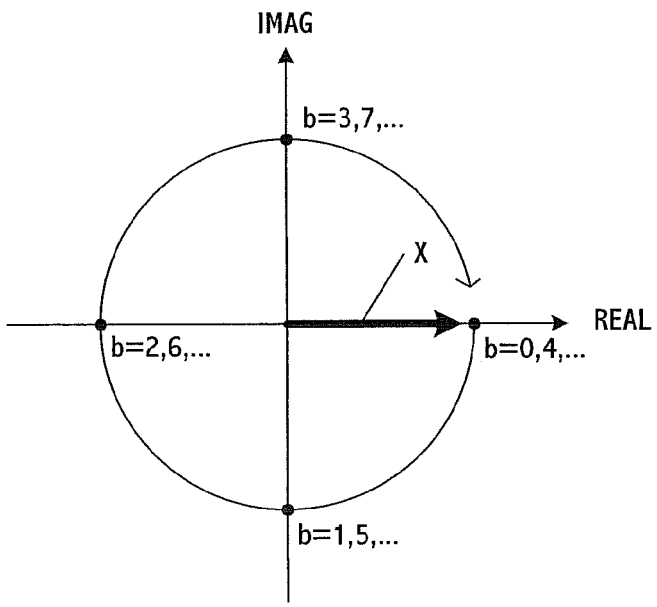
FIG. 5 shows an example of a plot of phasors generated at the different bit positions.

Given these equations, the phasor at a frequency of one quarter the bit rate for a pulse at time t=0 is shown by arrow X in FIG. 5. As shown, this arrow has a magnitude and phase, with the phase lying on the real axis of the plot. For a pulse period of 0 to 3Bt, the phase for the bit at time t=0 corresponds to a bit location b=0 and repeating at this location at bit locations 4, 8, and so on.

The phasor of a data bit located at time delayed by one bit time (t=BT) would have an arrow of the same magnitude pointing downward along the imaginary axis of (moving clockwise on) the plot at bit location b=1, 5, and so on. The phasor of a data bit located at a time delayed by two bit times (t=2BT) would have an arrow of the same magnitude pointing along the real axis of the plot at a bit location of b=2, 6, and so on. And, the phasor of a data bit located at a time delayed by three bit times (t=3BT) would have an arrow of a same magnitude pointing upwardly along the imaginary axis of the plot at a bit location of b=3, 7, and so on.

The aforementioned phasors are generated based on an illustrative set of parameters for use in generating a 4-bit codeword. In other embodiments, the parameters may change from bit-to-bit, or codeword-to-codeword, to generate phasors of different spectral magnitudes, phases, and/or bit positions. (A 10-bit codeword example will be discussed in greater detail in subsequent figures).

Using phasors defined based on the spectral characteristics, pulse positions, and bit positions shown in FIGS. 3-5, codewords may be generated from the bits in the bit stream. (Block 120). The codewords may be generated in a variety of ways in accordance with embodiments to be described. The manner in which the codewords are generated may either reduce spectral energy and/or achieve some predetermined level of spectral energy for data transmission.

When codewords are generated in a way which reduces spectral energy (e.g., compared with other techniques which, for example, use different bases for combining bits to generate codewords), the amount of interference in the terminal may be proportionally reduced, thereby alleviating the need to use conductive shielding. In other embodiments, spectral energy may be adjusted to achieve a different effect. Moreover, the methods described herein may be combined with a conductive shielding technique as previously described.

Once the codewords are formed, a phasor may be generated for the codeword at a single frequency in the bit-stream spectrum based on a sum of the phasors of the individual bits comprising the codeword at that frequency. (Block 130). The phasors of each bit in the codeword may be summed, for example, in the manner shown by Equation (4).

$$H(f) = \sum_{b=1}^{n} x_{bk} e^{-i2\pi bf/BR} \quad (4)$$

wherein $x_b$ represents each bit having a logical value of 0 or 1.

Figure 6:
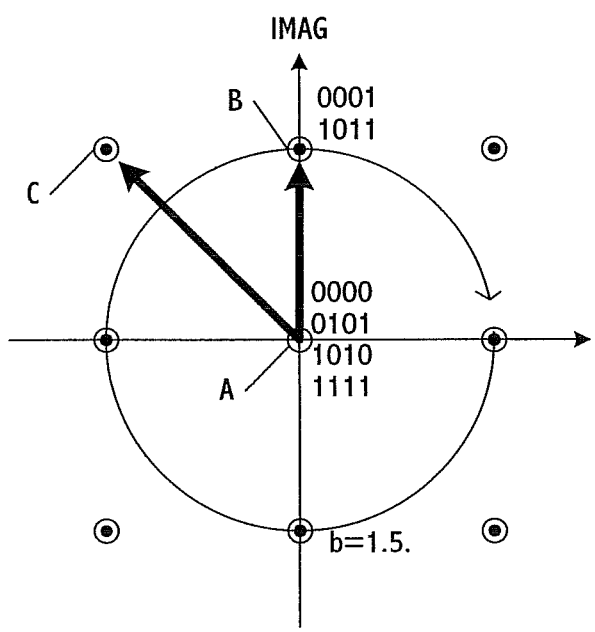
FIG. 6 shows an example of a plot of phasors generated for different codewords.

FIG. 6 shows an example of how phasors may be formed for a 4-bit codeword based on a sum of bit phasors defined based on the spectral characteristics, pulse positions, and bit positions shown in FIGS. 3-5. As shown in FIG. 6, the phasor for each codeword may be represented on a plot having real and imaginary axes. When summing the phasors for each bit, a logical value of 0 for the bit is considered not to have a phasor and a logical value of 1 is considered to have a phasor. Thus, the phasor generated for each code word, in effect, is generated taking only the phasors of the 1-value bits into consideration.

The following examples are shown on the plot of FIG. 6. The phasors for codewords comprised of the following bits have a zero value for both the real and imaginary components: 0000, 0101, 1010, 1111. This is because the sum of the phasors of these bit values cancel each other out, assuming that the phasor for each 1-value bit has the same magnitude.

Consider, for example, the codeword 0101 having 1-bit values at b=1 and b=3 positions. The phasors for these 1-value bits have spectral phase angles at 270° and 90°, respectively, taking the angles for the b values in FIG. 5 as a reference. When added, the sum of the phase angles equal 360° (or equivalently 0°) and the sum of their spectral magnitudes (being equal but opposite in sign) also equals zero. As a result, the phasor of the codeword 0101 lies at the origin of the plot indicated by circle A, which corresponds to zero spectral energy. The same phasors are generated for codewords 0000, 1010, and 111.

The phasors for other codewords are not located at the origin of the plot. For example, the phasors for codewords 0001 and 1011 corresponds to a value in circle B. This phasor has a magnitude corresponding to the length of the arrow pointing to circle B (which represents the magnitude of the phasor for an individual 1-value bit) and a phase angle generated based on the sum of the phase angles for the 1-value bits in these codewords. The phasor for the codeword 0011 is shown within circle C and has a magnitude equal to √2 times the magnitude of the phasor for a 1-value bit and a phase angle of 135°. The phasors for other codewords may be plotted using these principles.

In the illustrative embodiment of FIG. 6, the phasors for each bit are assumed to have essentially the same spectral magnitude. However, in other embodiments, the phasors for each bit value may have different values, which will be reflected in the phasors of the codewords generated from a sum of the phasors for these bits. Generating codewords based on phasor summation of the bits comprising the codeword provides a computationally efficient way of controlling the spectral energy of the data to be transmitted. According to one embodiment, this method may be used to control the amount of interference that is ultimately generated in the terminal.

Once the phasors for the codewords generated at one frequency are determined, the codewords may be transmitted through an interface, such as either interface shown in FIG. 1. Examples of how the codewords may be generated in Block 120 in FIG. 2 will now be discussed.

Block Coding

Figure 7:
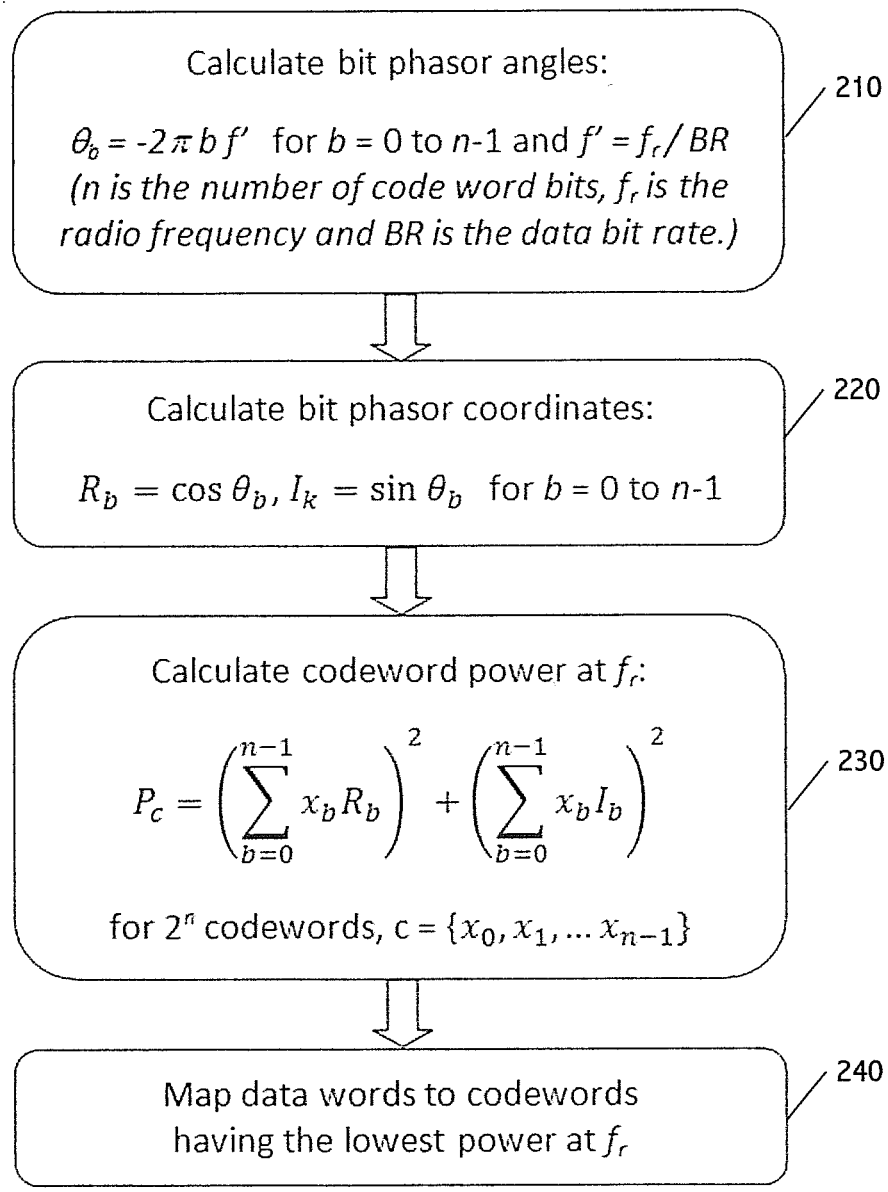
FIG. 7 shows a block coding technique for generating codewords.

Block coding may be performed in a variety of ways. One way, referred to as Minimum-Magnitude Block Coding, involves performing a one-to-one mapping of data words of a predetermined length to codewords. Referring to FIG. 7, this coding technique includes calculating the angle of the phasor for each bit based on Equation 5. (Block 210).

$$\theta_k = 2\pi k f' \text{ for } k=1 \text{ to } n \text{ and } f'=f_r/f_b \quad (5)$$

where n is the number of bits that comprise each codeword, $f_r$ is the single radio frequency, and $f_b$ is the data bit rate. Next, the coordinates of the phasor for each bit is calculated using Equation 6. (Block 220).

$$R_k = \cos \theta_k \text{ and } I_k = \sin \theta_k \text{ for } k=1 \text{ to } n \quad (6)$$

The codeword power spectral densities (PSDs) are computed from Equation 7. (Block 230).

$$P_c = \sum_{k=1}^{n} x_k (R_k^2 + I_k^2) \text{ for } 2^n \text{codewords,} \quad (7)$$

where $c = \{x_1, x_2, \ldots x_n\}$

Data words are then mapped in one-to-one correspondence with codewords having one or more of a predetermined number of the lowest PSDs taken from the Pc values computed by Equation 7. (Block 240). This one-to-one mapping may be performed based on one of a variety of criteria.

One criteria involves mapping codewords having the smallest phasor magnitude at a predetermined mitigation frequency out of all possible codewords to data words. This approach creates a spectral notch which can be used as a basis for achieving a certain level of performance, which, for example, may be to transmit the data at a minimum or reduced spectral energy as a way of limiting interference.

Another criteria involves mapping the codewords that have an equal values (or which are nearly equal to within a predetermined tolerance) in all bit positions, or where a sum of codewords have an equal or near equal value in all bit positions. This may minimize or in some cases even eliminate spikes in the spectral waveform.

Another criteria involves mapping codewords having a sum of phasor bit amplitudes that are lower than a predetermined threshold or which are otherwise minimized.

Figure 8:
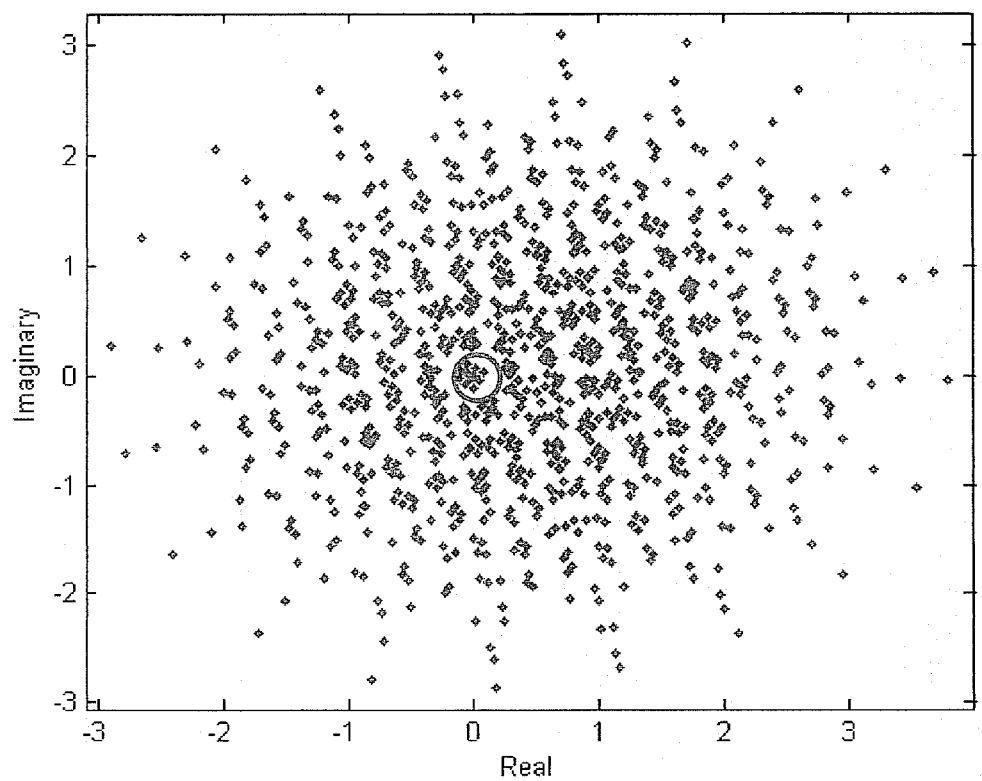
FIG. 8 shows a phasor diagram produced by block coding.

FIG. 8 shows a plot of phasors (shown as points) generated for codewords according to the block coding technique performed based on the first criteria. In this plot, the codewords that appear within the circle are selected to be mapped to the data words.

Zero-Sum Pair Block Coding

Another type of block coding is referred to as zero-sum pair block coding. This type of coding involves performing a one-to-two mapping, where each data word is associated with a unique code pair and mapped to the codewords of that pair in an alternating manner. Also, in this approach, some data words may be mapped in one-to-one correspondence to zero-magnitude codewords. This approach may also be performed so that no codeword belongs to more than one code pair.

In accordance with one embodiment, the members of each pair may be chosen from minimum magnitude codewords such that a phasor sum of each pair is reduced by some predetermined amount or minimized such that the sum is near or exactly zero, if possible. Moreover, codewords may be optionally selected to minimize the phasor sum over all codewords, in a case where the sum over every pair is not zero.

Figure 9:
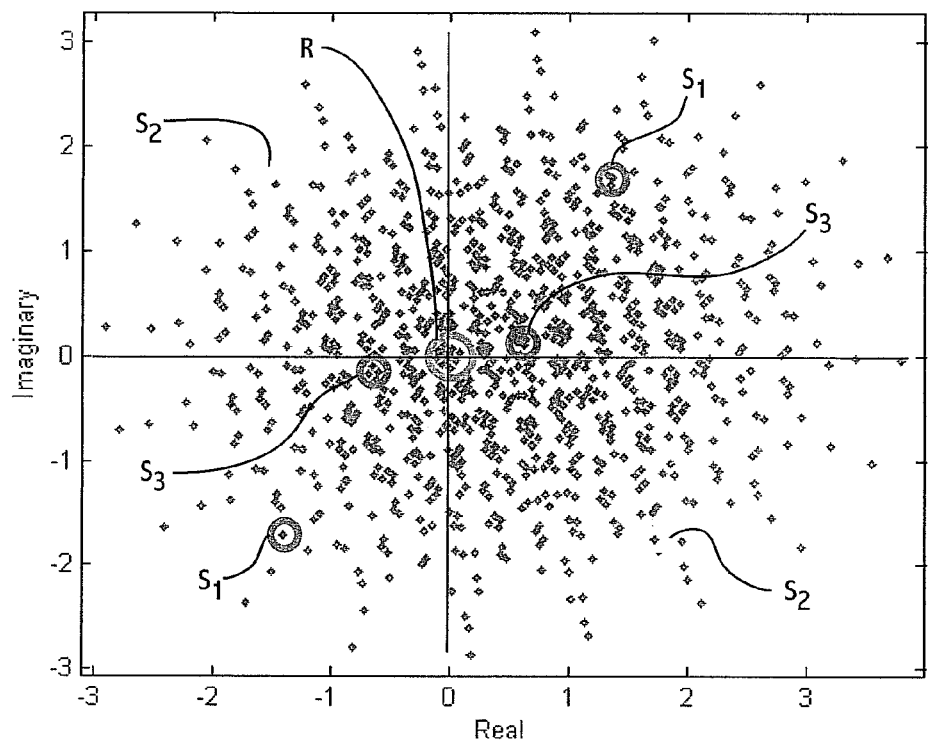
FIG. 9 shows a phasor diagram produced by zero-sum block pair coding.

FIG. 9 shows an example of a phasor diagram that may be generated according to this method. In this example, a number of individual codewords (which are not paired) have and therefore will be mapped to phasors with zero or near-zero magnitude. Phasors of this type are shown within circle R in the phasor diagram.

Other and/or remaining codewords are selected in pairs so that the phasors corresponding to each of the pairs will have a net-zero magnitude. This may be accomplished, for example, by locating phasors for individual codewords that have opposing magnitudes and phase angles, pairing them, and then generating data words based on those pairs. Each data word is based on two codewords to form a one-to-two mapping. Examples of phasor pairs are shown in circles S1, S2, and S3 in the phasor diagram. Additionally, or alternatively, the method may be implemented so that each time a data word mapped to one of these pairs of circles, the choice of which codeword is used may alternate so that the phasor contribution for that codeword cancels to zero on average.

Figure 10:
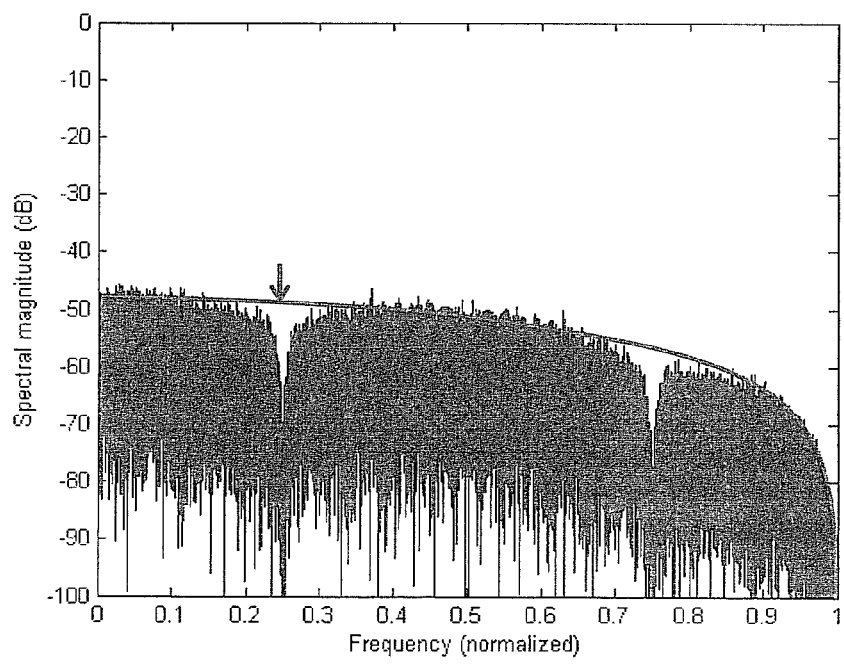
FIG. 10 shows a spectral diagram generated using zero-sum block pair coding.

FIG. 10 shows an example of a spectral waveform diagram that may be generated using zero-sum block pair coding for a 3-bit to 4-bit codeword mapping for at a single radio frequency of one quarter the bit rate (or which equivalently may be produced for any odd multiple of this frequency). As shown in this diagram, two notches are generated at normalized frequencies of approximately 0.25 and 0.75. The notches generated by phasor cancellation in this type of coding indicates that the IO bus energy may be reduced by more than 10 dB or more in this example.

Running Sum Block Coding

Another type of block coding is referred to as running sum block coding. The type of coding involves performing a one-to-p mapping (p>1), where each data word is associated with a unique code group having p codewords and mapped to a codeword in the group which reduces or minimizes a running signal phasor (within the receiver's bandwidth). In implementing this method, no codeword may belong to more than one code group.

Also, the codewords in each group may be chose from minimum magnitude codewords, such that their phasor sum in reduced or minimized (and made to be zero, if possible).

In performing this type of coding, some data words may optionally be mapped in one-to-one correspondence to zero magnitude codewords. Also, the codewords may be selected to that their corresponding phasors are spaced at predetermined intervals (or even equally spaced) on a common circle in the phasor diagram. In an equal spacing application, this would require the selected phasors in each group to have the same or similar magnitude with $2\pi/p$ radians between each codeword and an adjacent or nearest codeword in either direction on or near the circle).

Figure 11:
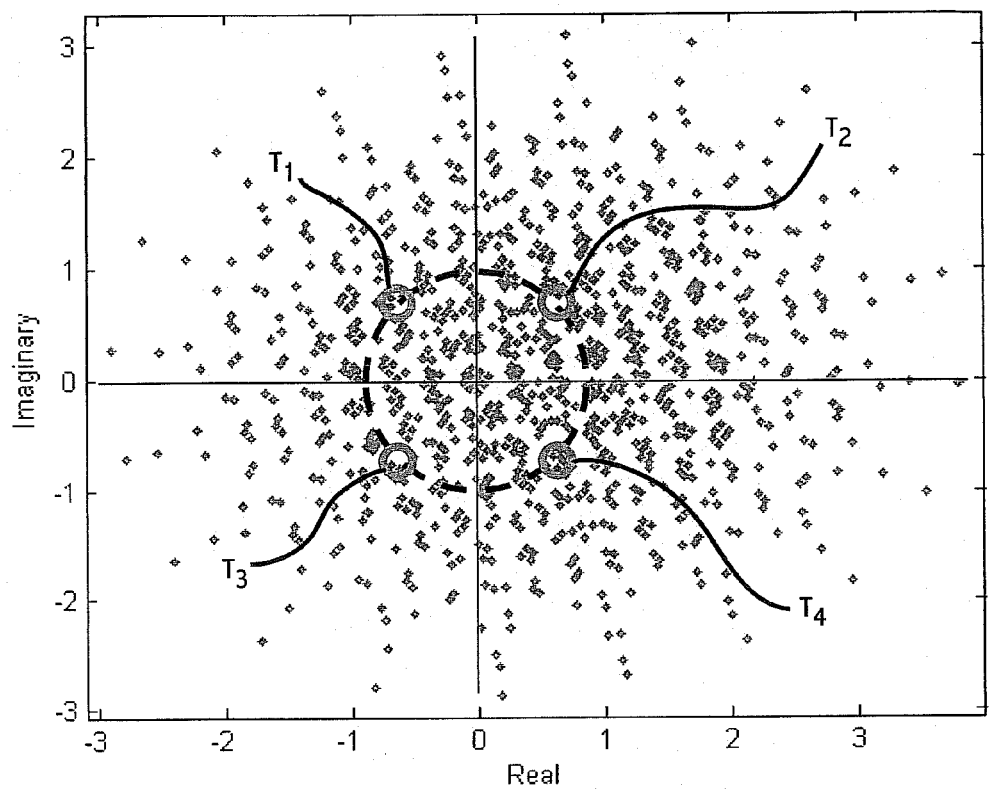
FIG. 11 shows a phasor diagram produced by running sum block coding.

FIG. 11 shows an example of a phasor diagram that may be generating using this type of coding. In this example, one data word may be mapped to four possible codewords (p=4). The phasors for these four codewords are shown in circles T1 to T4 in the diagram. If the running phasor of the data stream up to the point when the data word corresponding to the phasors in these circles lies in a given quadrant, then the codeword having a phasor in the opposite quadrant is chosen along with another pair of opposing phasors that lie along or substantially along the circle, to thereby generate a phasor for the 4-codeword group that is reduced or effectively canceled out. This group is then mapped to a data word to be transmitted.

Other types of coding may be used for purposes of mapping data words to codewords. One example includes bit stuffing, where stuff or dummy bits are chosen to minimize a running phasor sum within the bandwidth of a receiver or transmitter. In one embodiment, the stuff bits (e.g., non-information bits) may be inserted onto the IO bus during existing gaps in the data stream, which may include one or more of during a bus idle state or where inter-packet gaps take place.

Another type of coding is referred to as running phase disparity. According to this approach, data is encoded as a running stream in a manner, for example, similar to a data scrambler but based on rules which generate one or more notches in the spectrum at a predetermined radio frequency where the codewords/phasors are generated. This approach is different from an approach taken to so-called "whiten" the data spectrum.

Another type of coding is referred to as parallel-serial coding. According to this approach, data is encoded across the IO bus width, as well as in time, to improve coding performance. An example of parallel radio frequency interference (RFI) encoding involves encoding single-ended lines to fully differential lines.

The aforementioned embodiments may be implemented in software, hardware, or a combination thereof. When implemented at least partially in software, a program may be stored in the terminal to control operation of the processor, which, for example, may considered to encompass one or more terminal chips. The program may be stored on a computer-readable medium such as but not limited to a storage device or memory located within or coupled to the terminal, and may include code for performing the operations included in various embodiments of the method described herein.

In accordance with one or more of the aforementioned embodiments, the spectral energy may represent the spectral energy of the codewords (and/or data words formed from the codewords) transmitted on an IO bus. In other embodiments, the codewords or data words may be transmitted on another type of bus or signal line. While an IO bus may be considered to be an internal feature of a terminal or apparatus including or which perform the embodiments described herein, in other embodiments the bus or signal lines carrying the codewords for which spectral energy and interference are to be reduced may be coupled to and located externally from the apparatus or terminal. One non-limiting example contemplates the bus as being a Universal Serial Bus (USB) or other type of external interface.

Moreover, the codewords generated in accordance with one or more embodiments described herein may be formed independently from a waveform shape of the bits included in the codeword. Thus, in the case where different bits in the stream have different pulse or waveform shapes, the differences in these shapes will not adversely affect or complicate codeword formation.

Moreover, different bit pulse or waveform shapes may have different spectral characteristics, but one or more embodiments described herein may generate codewords irrespective and independent of these differing spectral characteristics because the spectral magnitude of the phasors generated for the codeword bits at any single frequency within a transmission spectrum may be independent of the pulse location in time, and the spectral phase shift at any single frequency of the spectrum may be linearly related to the pulse location in time.

One or more embodiments described herein may specifically be applied within a smart phone which operates based on multiple (e.g., 10) separate radio bands with hundreds of possible radio channels. The embodiments described herein may be separately applied to control the transmission of data within respective ones of these bands and channels. Moreover, the criteria (e.g., spectral frequency ranges of the phasors (e.g., the circles in the phasor diagrams)) may be different from band-to-band or even from channel-to-channel based on predetermined information stored in the terminal or apparatus.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of any one embodiment may be combined with features of one or more other embodiments to form new embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. An apparatus, comprising:
first logic to receive bits of data; and
second logic to generate a codeword from a predetermined number of the bits by:
  determining phasors for bits at only one frequency of a transmission spectrum,
  combining the phasors of bits that form a phasor having a spectral energy that lies within a predetermined range, and
  forming the codeword from the bits of the combined phasors, and the second logic is to combine the phasors by:
    identifying a phasor of a first bit that has a first angle and a first magnitude,
    selecting a phasor for a second bit that has a second angle and a second magnitude, and
    forming the codeword to include the first and second bits, wherein the first angle is spaced substantially 180° from the second angle.

2. The apparatus of claim 1, wherein the first magnitude is at least substantially equal to the second magnitude.

3. The apparatus of claim 1, wherein the phasors of bits corresponding to the codeword are to be combined to form a phasor with a spectral energy of substantially zero.

4. The apparatus of claim 3, wherein the formed phasor is to have a magnitude of substantially zero.

5. The apparatus of claim 1, wherein the predetermined range is between zero and a predetermined magnitude of the phasor formed from the combined phasors.

6. The apparatus of claim 1, wherein the processor is to:
generate a data word for transmission based on the codeword.

7. The apparatus of claim 6, wherein the data word includes only one codeword.

8. The apparatus of claim 6, wherein the data word includes at least two codewords and wherein one of the codewords is the codeword generated from the bits of the combined phasors.

9. The apparatus of claim 1, further comprising:
an interface to a data bus,
wherein the second logic is to output the codeword on the data bus through the interface.

10. The apparatus of claim 1, wherein the codeword is to be formed independent from a waveform shape of the bits corresponding to the codeword.

11. A system comprising:
one or more signal lines; and
a processor to generate a codeword from a predetermined number of bits to be transmitted on the one or more signal lines, the processor to generate the codeword by:
determining phasors for bits at only one frequency of a transmission spectrum,
combining the phasors of bits that form a phasor having a spectral energy that lies within a predetermined range, and
forming the codeword from the bits of the combined phasors, wherein the processor is coupled to a transmitter for transmitting the codeword, and the processor is to combine the phasors by:
identifying a phasor of a first bit that has a first angle and a first magnitude,
selecting a phasor for a second bit that has a second angle and a second magnitude, and
forming the codeword to include the first and second bits, wherein the first angle is spaced substantially 180° from the second angle.

12. The system of claim 11, wherein the first magnitude is at least substantially equal to the second magnitude.

13. The system of claim 11, wherein the phasors of bits that correspond to the codeword are to be combined to form a phasor with a spectral energy of substantially zero.

14. The system of claim 13, wherein the formed phasor is to have a magnitude of substantially zero.

15. The system of claim 11, wherein the codeword is to be formed independently from a waveform shape of the bits corresponding to the codeword.

16. A non-transitory computer-readable medium storing a program for managing information in a terminal, the program including:
first code to determine phasors for bits of data at only one frequency of a transmission spectrum;
second code to combine the phasors of bits that form a phasor having a spectral energy that lies within a predetermined range; and
third code to form a codeword from the bits of the combined phasors, and the second code is to:
identify a phasor of a first bit that has a first angle and a first magnitude,
select a phasor for a second bit that has a second angle and a second magnitude, and
form the codeword to include the first and second bits, wherein the first angle is spaced substantially 180° from the second angle.

17. The medium of claim 16, wherein the first magnitude is at least substantially equal to the second magnitude.

18. The medium of claim 16, wherein the phasors of bits corresponding to the codeword are to be combined to form a phasor with a spectral energy of substantially zero.

19. The medium of claim 18, wherein the formed phasor is to have a magnitude of substantially zero.

20. The medium of claim 16, wherein the predetermined range is between zero and a predetermined magnitude of the phasor formed from the combined phasors.

21. The medium of claim 16, further comprising:
generating a data word for transmission based on the codeword.

22. The medium of claim 21, wherein the data word includes only one codeword.

23. The medium of claim 22, wherein the data word includes at least two codewords and wherein one of the codewords is the codeword generated from the bits of the combined phasors.

24. The medium of claim 16, wherein the codeword is to be formed independent from a waveform shape of the bits corresponding to the codeword.

25. A method for managing information, comprising:
receiving bits of data;
determining phasors for bits at only one frequency of a transmission spectrum;
combining the phasors of bits that form a phasor having a spectral energy that lies within a predetermined range; and
forming a codeword from the bits of the combined phasors, and the combining of the phasors includes:
identifying a phasor of a first bit that has a first angle and a first magnitude,
selecting a phasor for a second bit that has a second angle and a second magnitude, and
forming the codeword to include the first and second bits, wherein the first angle is spaced substantially 180° from the second angle.

26. The method of claim 25, wherein the first magnitude is at least substantially equal to the second magnitude.

27. An apparatus, comprising:
first logic to receive bits of data; and
second logic to generate a codeword from a predetermined number of the bits by:
determining phasors for bits at only one frequency of a transmission spectrum,
combining the phasors of bits that form a phasor having a spectral energy that lies within a predetermined range, and
forming the codeword from the bits of the combined phasors, and the phasors of bits corresponding to the codeword are to be combined to form a phasor with a spectral energy of substantially zero.

28. The apparatus of claim 27, wherein the formed phasor is to have a magnitude of substantially zero.

29. The apparatus of claim 1, wherein the processor is to:
generate a data word for transmission based on the codeword.

30. The apparatus of claim 29, wherein the data word includes at least two codewords and wherein one of the codewords is the codeword generated from the bits of the combined phasors.

* * * * *